United States Patent [19]

Suppelsa et al.

[11] Patent Number: 5,338,391
[45] Date of Patent: Aug. 16, 1994

[54] METHOD OF MAKING A SUBSTRATE HAVING SELECTIVELY RELEASING CONDUCTIVE RUNNERS

[75] Inventors: Anthony B. Suppelsa, Coral Springs; William B. Mullen, III, Boca Raton; Glenn F. Urbish, Coral Springs, all of Fla.

[73] Assignee: Motorola, Inc., Schaumburg, Ill.

[21] Appl. No.: 134,447

[22] Filed: Oct. 12, 1993

[51] Int. Cl.$^5$ .............................. B44C 1/22; C23F 1/00
[52] U.S. Cl. ................................... 156/630; 156/634; 156/656; 156/659.1; 156/901
[58] Field of Search ............... 156/630, 634, 643, 650, 156/656, 659.1, 664, 665, 666, 901, 902; 29/846; 430/313, 318; 174/260

[56] References Cited

U.S. PATENT DOCUMENTS 4,582,564 4/1986 Shanefield et al. ............. 156/902 X
4,728,751 3/1988 Canestaro et al. ................ 174/68.5

*Primary Examiner*—William Powell
*Attorney, Agent, or Firm*—Dale W. Dorinski

[57] ABSTRACT

A selectively releasing runner and substrate assembly (10) comprises a plurality of conductive runners (16) adhered to a substrate (12). A portion (18) of at least some of the conductive runners have a lower adhesion to the substrate for selectively releasing the conductive runner from the substrate when subjected to thermal stress. The selectively releasing runner and substrate assembly is made by selectively depositing an adhesion layer (14) of a first metal to portions of the surface of the substrate where maximum adhesion is desired. The other portions of the substrate are not covered with the first metal. The first metal layer and the uncovered portions of the substrate surface are covered with a second metal layer (16). The adhesion of the second metal layer to the substrate is less than the adhesion of the second metal layer to the first metal layer, and less than the adhesion of the first metal layer tot he substrate. The second metal layer may be copper. Additionally, an electronic component (22), such as an integrated circuit, may be attached to the selectively releasing metal portion.

21 Claims, 2 Drawing Sheets

METHOD OF MAKING A SUBSTRATE HAVING SELECTIVELY RELEASING CONDUCTIVE RUNNERS

CROSS REFERENCE TO RELATED APPLICATIONS

This application is related to U.S. patent application Ser. No. 07/930,498, filed Aug. 17, 1992, by Suppelsa et al., now U.S. Pat. No. 3,280,139, entitled "Selectively Releasing Conductive Runner and Substrate Assembly," assigned to Motorola, Inc., which is a continuation of U.S. patent application Ser. No. 07/486,999, filed Mar. 1, 1990, by Suppelsa et al., now abandoned.

TECHNICAL FIELD

This invention relates generally to the field of substrates and more specifically to a method of making a substrate that reduces the stresses associated with the metallization interconnections between the substrate and an electronic component.

BACKGROUND

Direct die attachment to a substrate, such as a molded printed wiring board, a printed wiring board or a flexible circuit board, is known in the art, but is rarely used because of the poor reliability associated with the Thermal Coefficient of Expansion (TCE) mismatch between the die and substrate. The TCE mismatch causes the solder interconnect to eventually crack or otherwise fatigue the integral connections between the die and the substrate. For example, a silicon die has a TCE of $4.6 \times 10^{-6}$ mm/mm/° C. while a glass-filled printed wiring board has a TCE that ranges from 18 to $45 \times 10^{-6}$ mm/mm/° C. Temperature fluctuations will cause the die to expand and contract at a different rate than the printed wiring board, causing catastrophic stresses in the die interconnect metallizations. Therefore, a need exists for a method of directly attaching a die to a substrate that overcomes the problems resulting from differing thermal coefficients of expansion for the substrate and die.

SUMMARY OF THE INVENTION

Briefly, according to the invention, a selectively releasing runner and substrate assembly has a stress-relieving interconnect metallization that can selectively release form the substrate under an applied stress. The selectively releasing runner and substrate assembly is made by selectively depositing an adhesion layer of a first metal to portions of the surface of the substrate where maximum adhesion is desired. The other portions of the substrate are not covered with the first metal. The first metal layer and the uncovered portions of the substrate surface are covered with a second metal layer. The adhesion of the second metal layer to the substrate is less than the adhesion of the second metal layer to the first metal layer, and less than the adhesion of the first metal layer to the substrate.

In preferred embodiments, the second metal layer is copper. Additionally, an electronic component, such as an integrated circuit, is attached to the selectively releasing metal portion.

DETAILED DESCRIPTION OF THE PREFERRED EMBODIMENT

Figure 1:
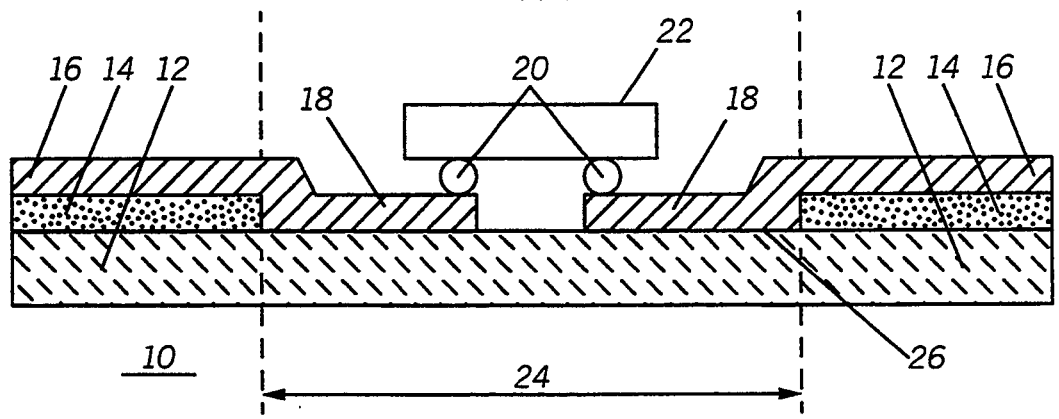
FIG. 1 is a cross-sectional view of a selectively releasing runner and substrate assembly (unaffected by stress) in accordance with the present invention.

While the specification concludes with claims defining the feature so the invention that are regarded as novel, it is believed that the invention will be better understood from a consideration of the following description in conjunction with the drawing figures, in which like reference numerals are carried forward. The reader will appreciate that the drawing figures are not drawn to scale, and the sizes of some features have been exaggerated to provide clarity.

Figure 2:
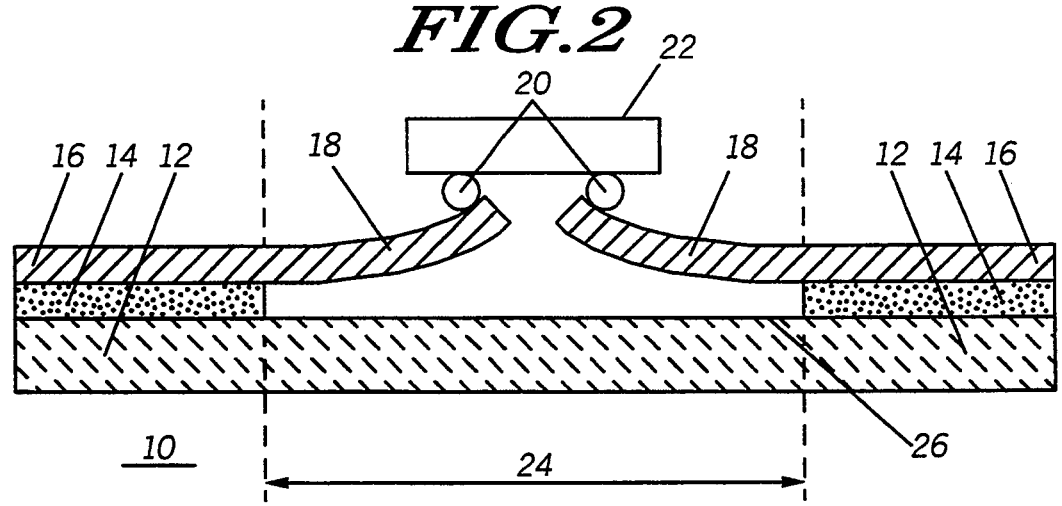
FIG. 2 is a cross-sectional view of the selectively releasing runner and substrate assembly of FIG. 1 (affected by stress).

Referring now to FIG. 1, there is shown a cross-sectional view of the selectively releasing runner and substrate assembly 10 in accordance with the present invention. A metal layer 14, such as chromium, nichrome, nickel, or titanium, is deposited on a substrate 12 to provide strong adhesion between the substrate and a conductive runner 16. The conductive runner 16 has a selectively releasable portion 18 that attaches directly to the substrate and has minimal adhesion to the substrate. The stress release zone 24 is that area where the selectively releasable portion 18 attaches directly to the substrate. An electronic component 22, such a semiconductor die or chip carrier, is mechanically and electrically attached to the selectively releasable conductive runner portion 18 by using solder 20. Referring to FIG. 2, when under thermal stress, the selectively releasable portion 18 of the conductive runner 16 releases from the substrate 12 in the stress release zone 24, while the conductive runner 16 remains tightly bonded where the metal layer 14 couples it to the substrate.

Figure 3:
FIG. 3 through 10 are cross-sectional views of the selectively releasing runner and substrate assembly in the various manufacturing steps in accordance with the present invention.
Figure 4:
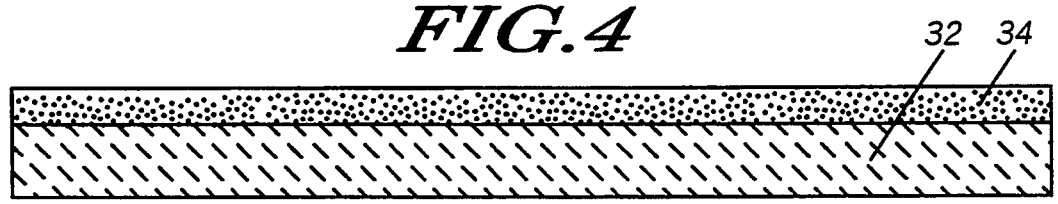
Figure 5:
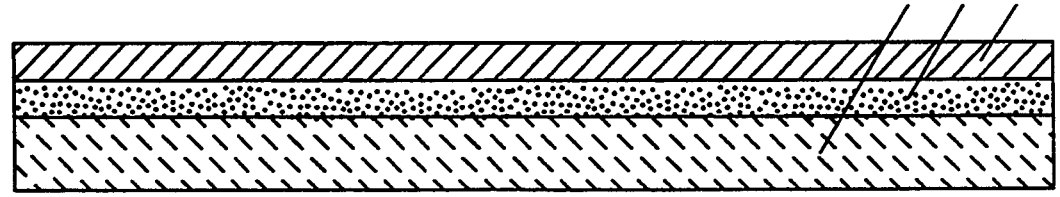

In FIGS. 3-10, the steps or process for manufacture of a selectively releasing runner and substrate assembly are illustrated. Referring now to FIG. 3, a substrate 32, preferably comprised of ceramic, flexible circuitry, printed wiring board, or molded printed wiring board is provided. The substrate 32 is preferably cleaned by first using a solution of hot water and detergent, and then by plasma cleaning. In FIG. 4, a thin film of a metal adhesion layer 34, such as aluminum, chromium, titanium, nichrome, or nickel, is preferably vacuum deposited onto the substrate 32 by sputtering, evaporating, or other vacuum deposition techniques. The thin film is typically in the range of 100–50,000 Ångstroms. In FIG. 5, another thin film metal layer 36, typically copper, is preferably vacuum deposited over the adhesion layer 34 while still under vacuum by sputtering, evaporating or other vacuum deposition techniques, creating maximum bonding between the metal layer 36 and the metal layer 34. This metal film 36 is typically thicker than the adhesion layer 34 and also in the range of 100–50,000 Ångstroms.

Figure 6:
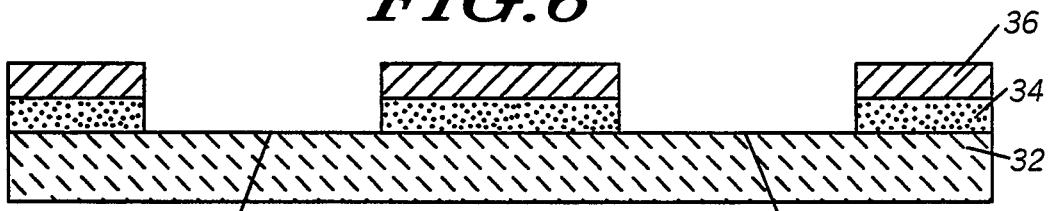
Figure 7:
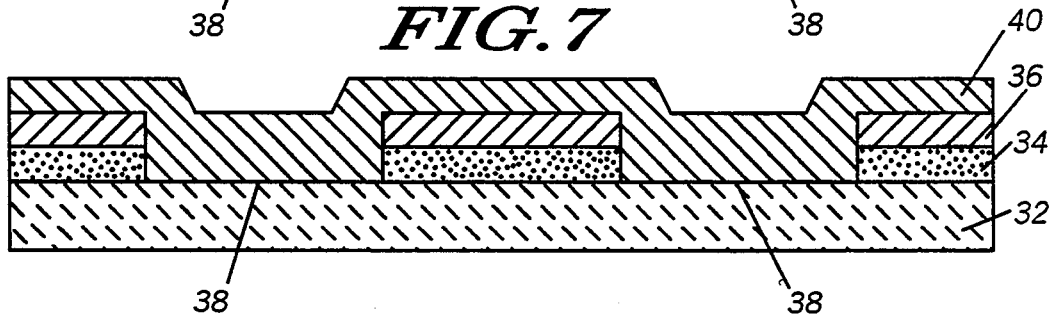
Figure 8:
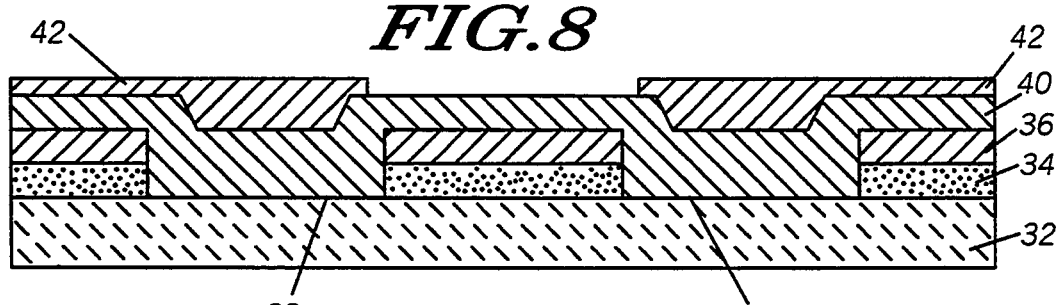
Figure 9:
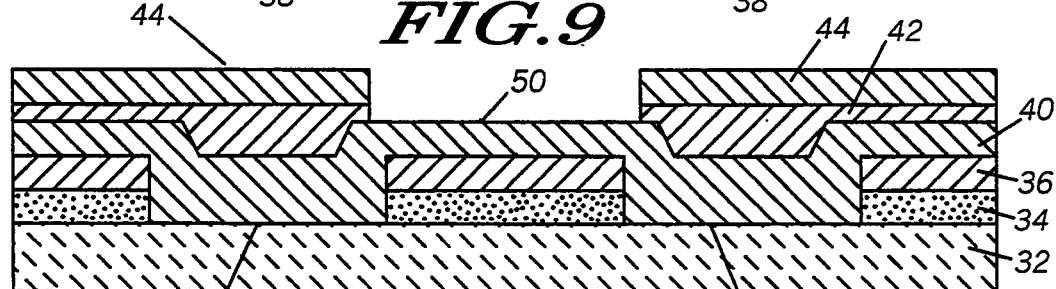
Figure 10:
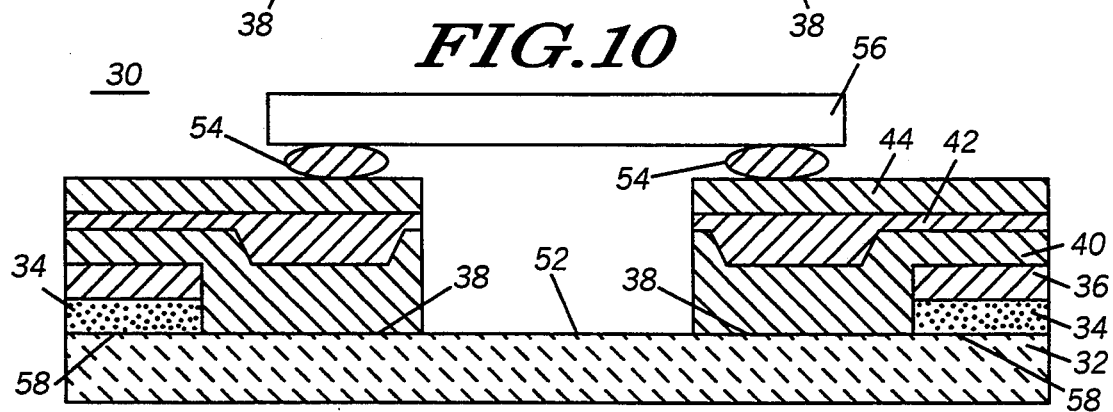

In FIG. 6, the selectively releasing areas 38 on the substrate 32 are defined (preferably by using photoresist) by using any of the well-known methods including chemical etching, sputter etching, reactive ion etching, or ion beam milling. These areas 38 expose the bare substrate after the removal of portions of the adhesion layer 34 and the metal layer 36. In FIG. 7, still another layer of metal 40, preferably copper, is sputtered over the entire substrate including the selectively releasing area 38. In FIG. 8, areas where the metal runners 42 are desired are defined or delineated, preferably using photoresist techniques, and electroplated with metal, preferably copper, forming layer 42. In FIG. 9, the electroplated layer 42 is overplated with a layer 44 of nickel and/or gold. In FIG. 10, the photoresist used in FIG. 8 is removed, and the areas 52 that were not electroplated or overplated with copper 42 or nickel 44 are etched back to the substrate, exposing area 52 of the substrate. This is known to those skilled in the art as a subtractive plating technique. Other plating techniques, such as additive plating, are also amenable, and would obviously employ a somewhat different sequence of photolithography and plating. Finally solder 54 is applied to the top surface of the metal runners 44 in order to mechanically and electrically attach an electronic component such as a die 56 or a ceramic chip carrier.

In summary, when the selectively releasing runner and substrate assembly 10 are subjected to thermal stresses arising from TCE's of the die 22 and the substrate 12, then the selectively releasing portions 18 of the metal runners in the selectively releasing zone 24 (where minimal adhesion is desired) will release from the substrate 12, as shown in FIG. 2. Meanwhile, these areas where maximum adhesion is desired (having the adhesion layer 14) remain tightly bonded to the substrate 12, so that the metal runners 16 are not disturbed. This relieves the stress imposed on the die 22 and the associated solder interconnections, thereby preventing cracking of fracture of the die or connections. Since the remaining portions of the circuitry remain tightly bonded to the substrate, the resulting assembly has high reliability when used in environments having thermal excursions.

While the preferred embodiments of the invention have been illustrated and described, it ,sill be clear to the invention is not so limited. Numerous modifications, changes, variations, substitutions and equivalents will occur to those skilled in the art without departing from the spirit and scope of the present invention as defined by the appended claims.

What is claimed is:

1. A process for manufacturing substrates with selectively releasing metallization, comprising the steps of:
    a) depositing an adhesion layer of a first metal to portions of the surface of a substrate where strong adhesion is desired, thereby leaving the remaining portions of the substrate surface uncovered; and
    b) coveting the first metal layer and the uncovered portions of the substrate surface with a second metal layer, forming a selectively releasing zone defined by an area where the second metal layer adheres directly to the substrate, the adhesion of the second metal layer to the substrate being less than the adhesion of the second metal layer to the first metal layer and also being less than the adhesion of the first metal layer to the substrate.

2. The process as described in claim 1, further comprising the step of attaching an electronic component to the second metal layer in the selectively releasing zone.

3. A process for manufacturing a substrate having selectively releasing metallization, comprising the steps of:
    a) providing an adhesion layer of metal on a substrate;
    b) providing a second metal layer on the adhesion layer;
    c) removing portions of the second metal layer and the adhesion layer to expose the substrate, thereby defining selectively releasing areas; and
    d) depositing a third layer of metal over portions of the second metal layer and portions of the selectively releasing areas to define circuit traces.

4. The process as described in claim 3, further comprising the step of overplating the circuit traces with a protective metal.

5. The process as described in claim 3, wherein the step of providing an adhesion layer comprises depositing a layer of aluminum, chromium, titanium, nichrome, or nickel on the substrate.

6. The process as described in claim 3, wherein the step of providing an second metal layer comprises depositing a layer of copper.

7. The process as described in claim 3, wherein the step of providing a third metal layer comprises depositing a layer of copper.

8. The process as described in claim 3, further comprising the step of attaching an electronic component to the circuit traces in the selectively releasing area.

9. A process for manufacturing a substrate having selectively releasing metallization, comprising the steps of:
    a) providing a substrate;
    b) vacuum depositing a thin film of a first metal to the surface of the substrate;
    c) vacuum depositing a thin film of a second metal on the first metal;
    d) defining areas that will subsequently be selectively releasing;
    e) removing the first and second metal films from the selectively releasing areas defined in step (d);
    f) depositing a layer of a third metal on the substrate surface in the selectively releasing areas and also on the second metal film; and
    g) defining conductive runners in the layer of the third metal including at least a portion of the selectively releasing areas.

10. The process as described in claim 9, wherein the step of providing a substrate comprises the substeps:
    ai) cleaning the substrate in a solution of detergent and hot water;
    aii) drying the cleaned substrate
    aiii) plasma etching the substrate.

11. The process as described in claim 9, wherein the step of vacuum depositing a thin film of a first metal comprises sputtering a layer of aluminum, chromium, titanium, nichrome, or nickel on the substrate.

12. The process as described in claim 9 wherein the step of vacuum depositing a thin film of a second metal comprises sputtering a layer of copper.

13. The process as described in claim 9, wherein the step of depositing a third metal layer comprises depositing a layer of copper.

14. The process as described in claim 9, wherein the step of defining areas comprises photolithography.

15. The process as described in claim 9, wherein the step of removing the first and second metal films comprises chemical etching.

16. The process as described in claim 13, wherein the step of depositing a layer of a third metal comprises sputtering or electroless plating.

17. The process as described in claim 9, wherein the step of defining conductive runners comprises photolithography and subtractive plating.

18. The process as described in claim 9, wherein the step of defining conductive runners comprises photolithography and additive plating.

19. The process as described in claim 9, further comprising the step of attaching an electronic component to the conductive runners in the selectively releasing area.

20. The process as described in claim 9, further comprising a final step of overplating the conductive runners with nickel, gold or solder.

21. A process for manufacturing a substrate having selectively releasing metallization, comprising the steps of:
a) providing a substrate;
b) vacuum depositing a thin film of a first metal selected from the group consisting of aluminum, chromium, titanium, nichrome, or nickel to the surface of the substrate;
c) vacuum depositing a thin film of copper on the first metal;
d) photolithographically defining areas that will subsequently be selectively releasing zones;
e) chemically etching the copper film and the first metal film from the photolithographically defined areas to expose the substrate in the selectively releasing zones;
f) depositing a layer of copper on the substrate surface in the selectively releasing zones and also on the copper film; and
g) defining conductive runners in the deposited copper layer including at least a portion of the selectively releasing zones.

* * * * *

UNITED STATES PATENT AND TRADEMARK OFFICE
CERTIFICATE OF CORRECTION

PATENT NO. : 5,338,391

DATED : August 16, 1994

INVENTOR(S) : Suppelsa, et al.

It is certified that error appears in the above-indentified patent and that said Letters Patent is hereby corrected as shown below:

Column 3, line 56, claim 1(b), delete "coveting" and insert therefor -- covering --.

Signed and Sealed this

Eighteenth Day of October, 1994

Attest:

BRUCE LEHMAN

Attesting Officer

Commissioner of Patents and Trademarks